United States Patent
Kim et al.

(10) Patent No.: US 10,157,685 B2
(45) Date of Patent: Dec. 18, 2018

(54) MEMORY DEVICE AND OPERATING METHOD THEREOF

(71) Applicant: SK hynix Inc., Gyeonggi-do (KR)

(72) Inventors: Tae-Kyun Kim, Gyeonggi-do (KR); Jin-Hee Cho, Gyeonggi-do (KR); Jun-Gi Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 15/089,230

(22) Filed: Apr. 1, 2016

(65) Prior Publication Data

US 2017/0154688 A1 Jun. 1, 2017

(30) Foreign Application Priority Data

Nov. 27, 2015 (KR) .................. 10-2015-0167633

(51) Int. Cl.
*G06F 11/14* (2006.01)
*G06F 11/36* (2006.01)
(Continued)

(52) U.S. Cl.
CPC .......... *G11C 29/38* (2013.01); *G06F 11/1451* (2013.01); *G06F 11/3668* (2013.01); *G11C 29/04* (2013.01); *G11C 29/1201* (2013.01); *G11C 29/14* (2013.01); *G11C 29/18* (2013.01); *G11C 29/36* (2013.01); *G11C 29/44* (2013.01); *G11C 29/46* (2013.01); *G11C 29/50016* (2013.01); *G11C 29/72* (2013.01); *G11C 29/76* (2013.01); *G11C 29/783* (2013.01); *G06F 2201/805* (2013.01); *G06F 2201/84* (2013.01);

*G11C 2029/0403* (2013.01); *G11C 2029/1202* (2013.01); *G11C 2029/1204* (2013.01); *G11C 2029/1806* (2013.01)

(58) Field of Classification Search
CPC ......... G06F 2212/7207; G06F 12/0246; G06F 2201/84; G06F 11/1469; G06F 11/1471; G06F 2212/7201; G06F 11/14
USPC ........................................ 714/764
See application file for complete search history.

(56) References Cited

U.S. PATENT DOCUMENTS 5,157,634 A * 10/1992 Dhong ............... G11C 11/406
365/149
7,225,375 B2 * 5/2007 Cochran .............. G11C 29/14
714/733

(Continued)

FOREIGN PATENT DOCUMENTS

KR 1020130117198 10/2013
KR 1020170023249 3/2017

*Primary Examiner* — James C Kerveros
(74) *Attorney, Agent, or Firm* — IP & T Group LLP

(57) ABSTRACT

A memory device may include a plurality of memory cells; one or more backup memory cells; a test circuit suitable for performing a backup operation and a test operation to a test target cell selected among the plurality of memory cells; and a control circuit suitable for accessing the backup memory cells instead of the test target cell during the performance of the test operation after completion of the backup operation for the selected test target cell, wherein, during the backup operation, the test circuit controls the control circuit to copy an original data of the test target cell to a corresponding backup memory cell selected among the backup memory cells, and wherein, during the test operation, the test circuit determines whether the test target cell is a pass or a fail.

15 Claims, 7 Drawing Sheets

(51) Int. Cl.
    *G11C 29/00*     (2006.01)
    *G11C 29/04*     (2006.01)
    *G11C 29/12*     (2006.01)
    *G11C 29/14*     (2006.01)
    *G11C 29/18*     (2006.01)
    *G11C 29/36*     (2006.01)
    *G11C 29/38*     (2006.01)
    *G11C 29/44*     (2006.01)
    *G11C 29/46*     (2006.01)
    *G11C 29/50*     (2006.01)

(56) References Cited

U.S. PATENT DOCUMENTS

| | | | |
|---|---|---|---|
| 7,594,157 B2 * | 9/2009 | Choi | G11C 11/5628 365/185.09 |
| 7,689,880 B2 * | 3/2010 | Kawasaki | G11C 29/56 714/710 |
| 7,739,559 B2 * | 6/2010 | Suzuki | G11C 29/76 714/710 |
| 8,661,301 B1 * | 2/2014 | Yen | G11C 16/22 711/103 |
| 8,738,974 B2 * | 5/2014 | Honda | G06F 11/141 711/103 |
| 8,976,604 B2 | 3/2015 | Hung | |
| 9,589,676 B2 | 3/2017 | Choi et al. | |
| 2013/0173970 A1 * | 7/2013 | Kleveland | G11C 29/44 714/710 |
| 2015/0169409 A1 * | 6/2015 | Cho | G06F 11/1088 714/764 |

* cited by examiner

IR_RADD = 001010(10)

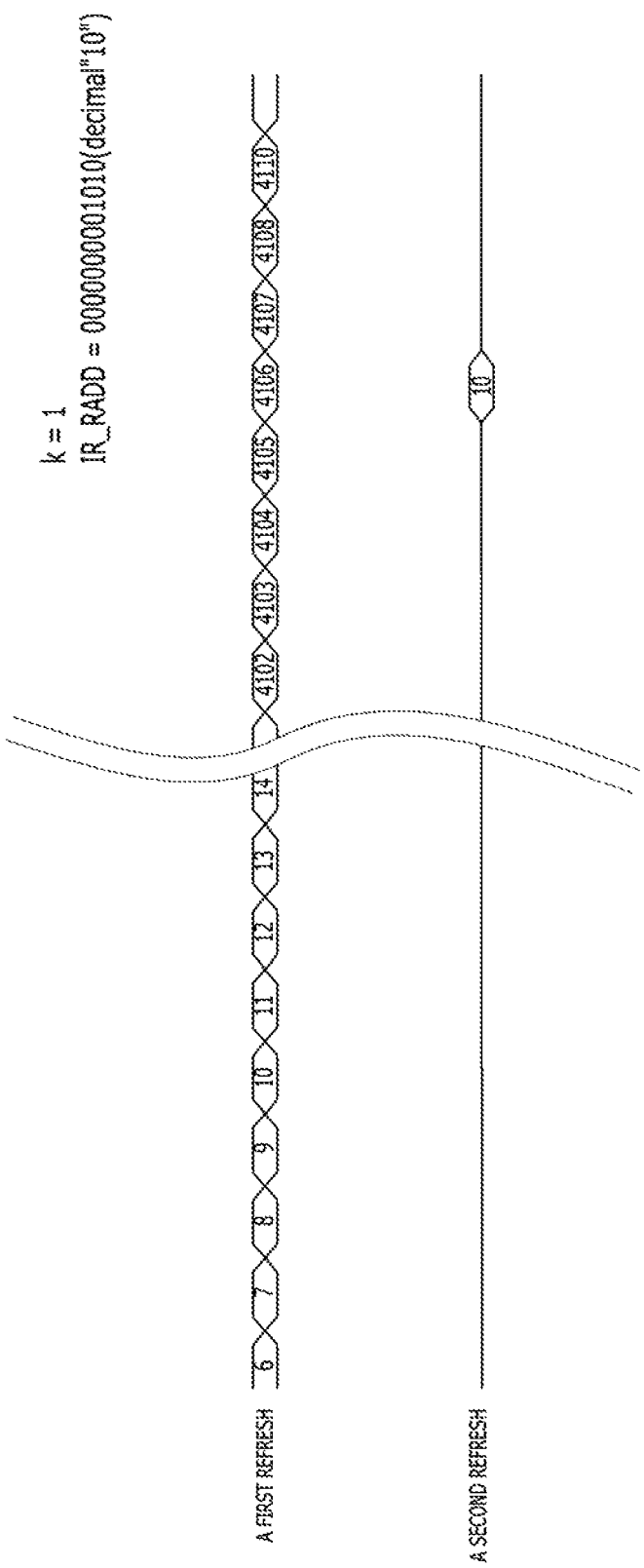

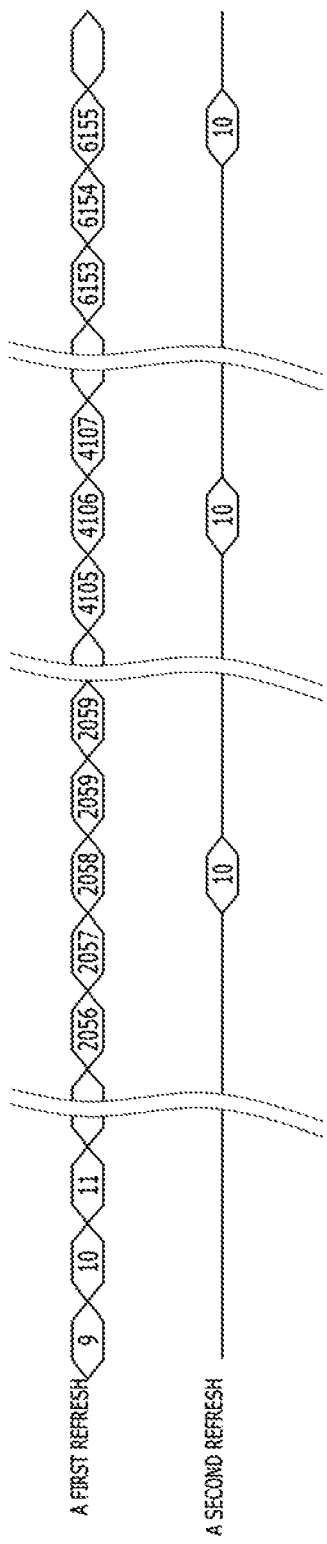

MEMORY DEVICE AND OPERATING METHOD THEREOF

CROSS-REFERENCE TO RELATED APPLICATION

The present application claims priority of Korean Patent Application No. 10-2015-0167633 filed on Nov. 27, 2015, which is incorporated herein by reference in its entirety.

BACKGROUND

1. Field

Exemplary embodiments of the present invention relate to a memory device and an operating method of the memory device.

2. Description of the Related Art

A memory cell of a memory device includes a transistor functioning as a switch and a capacitor for storing charges (i.e., data). The logic level of the data is divided into "high" (logic 1) or "low" (logic 0) depending on whether charges are present in the capacitor of the memory cell, that is, whether a voltage at the terminal of the capacitor is high or low.

In principle data retention of data does not consume power because the data is retained in the capacitor of a memory cell as accumulated charges. However, in practice, stored data may be lost because the initial amount of charges stored in the capacitor of a memory cell degrades overtime due to a leakage current attributable to the PN coupling of a MOS transistor. To prevent such a loss, stored data within a memory cell needs to be read before the data is lost, and the normal amount of charges needs to be recharged based on the read information. Data is retained when such an operation for recharging cell charges, also known as a refresh operation, is periodically repeated.

A refresh operation is performed whenever a refresh command is inputted from a memory controller to a memory device. The memory controller inputs the refresh command to the memory device at a specific time interval by taking the data retention time of the memory device into consideration. For example, when the data retention time of the memory device is 64 ms and all of memory cells within the memory device are refreshed only when the refresh command is inputted 8000 times, the memory controller needs to input 8000 refresh commands to the memory device during 64 ms. During manufacturing of a memory device, in a quality test process of the memory device, when the data retention times of some memory cells do not reach a predetermined reference time, the memory device is treated as a malfunctioning device. The malfunctioning memory device must be discarded.

Throughput is reduced when a memory device including memory cells having data retention times below the reference time is treated as a failed or malfunctioning device. Furthermore, although a memory device may have passed the quality test, an error may still occur in the memory device if, after the test, the data retention time of a memory cell becomes lower than the reference time for a variety of reasons.

SUMMARY

Various embodiments are directed to a memory device capable of detecting memory cells having a data retention time under a reference time while the memory device operates, and an operating method of the memory device.

Also, various embodiments are directed to a memory device capable of performing a refresh operation so that memory cells having a data retention time under a reference time can normally operate and an operating method of the memory device.

In an embodiment, a memory device may include a plurality of memory cells; one or more backup memory cells; a test circuit suitable for performing a backup operation and a test operation to a test target cell selected among the plurality of memory cells; and a control circuit suitable for accessing the backup memory cells instead of the test target cell during the performance of the test operation after completion of the backup operation for the selected test target cell, wherein, during the backup operation, the test circuit controls the control circuit to copy an original data of the test target cell to a corresponding backup memory cell selected among the backup memory cells, and wherein, during the test operation, the test circuit determines whether the test target cell is a pass or a fail.

In an embodiment, an operating method of a memory device including a plurality of memory cells and one or more backup memory cells may include performing a backup operation to copy an original data of a test target cell among the plurality of memory cells to a corresponding one of the backup memory cells; performing a test operation to determine whether the test target cell is a pass or a fail cell; and controlling the backup memory cells to be accessed instead of the test target cell during the test operation after the backup operation.

BRIEF DESCRIPTION OF THE DRAWINGS

FIGS. 8a and 8b are diagrams illustrating first and second refresh operations performed, according to a second embodiment of the present invention.

DETAILED DESCRIPTION

Figure 1:
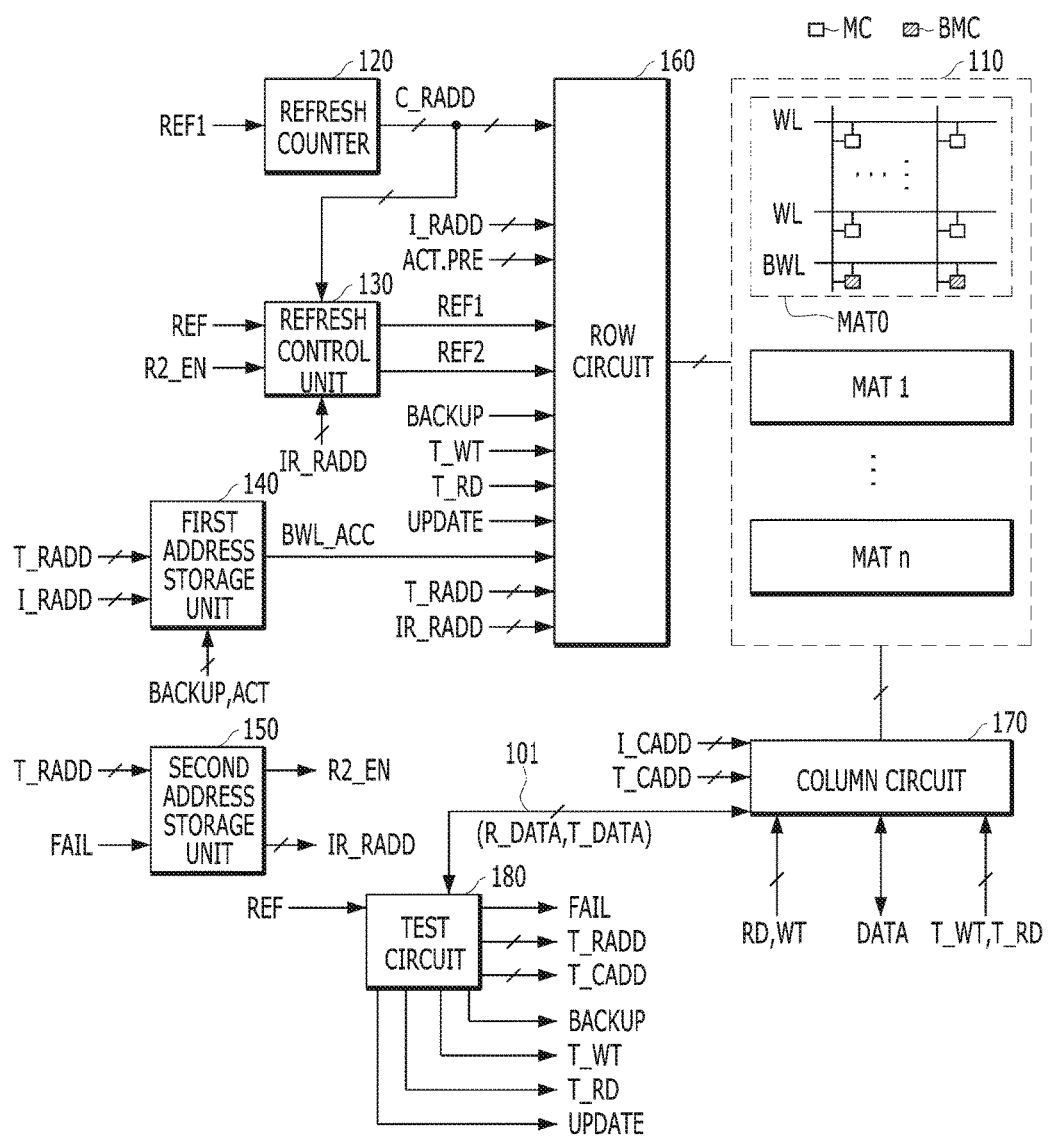
FIG. 1 is a diagram showing the configuration of a memory device, according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention.

Hereinafter, a first refresh operation refers to a normal refresh operation by which all of word lines (or all of memory cells) included in a cell array (e.g., a memory bank) are refreshed sequentially once during a refresh section tRFC. A second refresh operation refers to an additional refresh operation so that even a failed word line (e.g., a word line having a data retention time under a predetermined reference time) can retain its stored data.

Referring now to FIG. 1 a memory device is provided, according to an embodiment of the present invention.

Accordingly, the memory device may include a cell array 110, a refresh counter 120, a refresh control unit 130, a first address storage unit 140, a second address storage unit 150, a row circuit 160, a column circuit 170, and a test circuit 180.

The refresh counter 120, the refresh control unit 130, the first address storage unit 140, the second address storage unit 150, the row circuit 160, and the column circuit 170 may form a control circuit for controlling the operation of the cell array 110.

The cell array 110 may include a plurality of cell mats MAT0 to MATn (n is a natural number). Each of the cell mats MAT0 to MATn may include a plurality of word lines WL, one or more backup word lines BWL, a plurality of bit lines BL, a plurality of memory cells MC coupled between the word lines WL and the bit lines BL, and a plurality of backup memory cells BMC coupled between the backup word lines BWL and the bit lines BL.

The refresh counter 120 may generate a counting address C_RADD for the first refresh operation when a first refresh signal REF1 is enabled. The refresh counter 120 may increase the value of the counting address C_RADD by 1 when the first refresh signal REF1 is enabled. By increasing the value of the counting address C_RADD by 1 the word lines are refreshed by the first refresh operation in a sequentially ascending order.

The refresh control unit 130 may enable the first refresh signal REF1 when a refresh command REF is applied. The refresh control unit 130 may also enable a second refresh signal REF2 when a specific condition is met. According to a first embodiment of the present invention, the refresh control unit 130 may enable the second refresh signal REF2 for an IR address IR_RADD, which represents a row address of a failed memory cell, when a preset number of refresh commands REF is applied during enablement of a second refresh enable signal R2_EN. The second refresh signal R2_EN represents an occurrence of a failed memory cell. According to a second embodiment of the present invention, the refresh control unit 130 may enable the second refresh signal REF2 for the IR address IR_ADDR when the refresh command REF is applied under the condition that a predetermined number of bits are different and the remaining bits are the same between the counting address C_RADD and the IR address IR_RADD during enablement of the second refresh enable signal R2_EN.

The first address storage unit 140 may store the address of memory cells which is a test target of a current test operation as a first address. When a backup signal BACKUP is enabled for the backup of original data stored in the test target cell, the first address storage unit 140 may store a test row address T_RADD as the first address, as further described later.

The second address storage unit 150 may store the test row address T_RADD as a second address when a fail signal FAIL representing an occurrence of a failed memory cell is enabled. When the second address is stored, the second address storage unit 150 may enable the second refresh enable signal R2_EN and output the stored second address as the IR address IR_RADD.

The row circuit 160 may control the active and precharge operations of a word line selected by the counting address C_RADD, the IR address IR_RADD, or the test row address T_RADD. The row circuit 160 may activate the selected word line when the active command ACT is applied and may precharge the activated word line when a precharge command PRE is applied.

The row circuit 160 may perform the first refresh operation to a selected word line which corresponds to the counting address C_RADD when the first refresh signal REF1 is enabled. The row circuit 160 may also perform the second refresh operation to a failed selected word line which corresponds to the IR address IR_RADD when the second refresh signal REF2 is enabled. In this case, the refresh operation may mean that the selected word lines are activated during a specific section.

The row circuit 160 may activate and precharge a test target word line selected by the test row address T_RADD during a specific section when the backup signal BACKUP is enabled for a backup operation, and then may activate and precharge a backup word line BWL during a specific section. Through such backup operation, the original data of the target test memory cells MC coupled to the test target word line selected by the test row address T_RADD may be copied to backup memory cells BMC coupled to the backup word line BWL.

Furthermore, when a test write signal T_WT or a test read signal T_RD is enabled for the test operation after the backup operation, the row circuit 160 may activate and precharge the test target word line selected by the test row address T_RADD during a specific section. When the test write signal T_WT is enabled, reference data R_DATA may be written in the test target cells MC selected by the test row address T_RADD and the test column address T_CADD. When the test read signal T_RD is enabled, the test data T_DATA of the test target cells MC selected by the test row address T_RADD and the test column address T_CADD may be read out to the test circuit 180 through the column circuit 170.

When an update signal UPDATE is enabled for returning the original data from the backup memory cells BMC to the test target cells MC after the test operation, the row circuit 160 may activate and precharge the backup word line BWL during a specific section and may activate and precharge the test target word line selected by the test row address T_RADD during a specific section. Through such update operation, the original data of the backup memory cells BMC coupled to the backup word line BWL may be returned to the test target cells MC coupled to the test target word lute selected by the test row address T_RADD.

The column circuit 170 may transfer the reference data R_DATA to the test target bit lines BL selected by the test column address T_CADD when a test write signal T_WT is enabled, and may transfer the test data T_DATA of the test target bit lines BL to the test circuit 180 when the test read signal T_RD is enabled. Reference number "101" in FIG. 1 denotes a plurality of lines through which the reference and test data R_DATA and T_DATA are transferred between the column circuit 170 and the test circuit 180.

The test circuit 180 may test the data retention time of the test target cells MC. When the data retention time of the test target cells MC is equal to or greater than a predetermined reference time, the test circuit 180 may determine the test target cells MC to be properly functioning cells also referred to for simplicity as proper cells ("pass"). When the data retention time of the test target cells MC is smaller than the reference time, the test circuit 180 may determine the test target cells MC as failed cells.

The test circuit 180 may disable the fail signal FAIL in the former case and may enable the fail signal FAIL in the latter case. The test circuit 180 may perform the test operation to the test target cells MC in a refresh section when the refresh command REF is applied. In this case, the first and second refresh operations and the test operation may be performed to different cell mats among the cell mats MAT0 to MATn.

The test circuit 180 may test the data retention time of the test target cell MC as follows. The test circuit 180 may generate the test row address T_RADD and the test column address T_CADD for selecting the test target cells MC. The test circuit 180 may enable the backup signal BACKUP for the backup operation in response to a first refresh command REF. When the backup signal BACKUP is enabled, the original data of the test target cells MC coupled to the test target word line corresponding to the test row address T_RADD may be copied to backup memory cells BMC coupled to the backup word line BWL.

The test circuit 180 may enable the test write signal T_WT in response to a second refresh command REF. Then, the reference data R_DATA may be written in the test target cells MC selected by the test row address T_RADD and the test column address T_CADD (hereinafter referred to as a test write operation).

The test circuit 180 may enable the test read signal T_RD in response to a third refresh command REF. Then, the test data T_DATA may be read from the test target cells MC and transferred to the test circuit 180. The test circuit 180 may compare the test data T_DATA with the reference data R_DATA and determine whether the data retention time of the test target cells MC is equal to or greater than the reference time (hereinafter referred to as a test comparison operation). In this case, the reference time may be equal to or greater than a time gap between two consecutive inputs of refresh commands REF.

When the test target cell MC is a normal cell having a data retention time equal to or greater than the reference time, the test target cell MC retains the reference data R_DATA written therein as is, without any substantial degradation, during the reference time. Hence, the test data T_DATA stored therein and the reference data R_DATA written therein should be the same. On the other hand, when the test target cell MC is a failed cell having a data retention time smaller than the reference time, the test target cell MC may not retain the reference data R_DATA as is, without any substantial degradation, during the reference time and thus the test data T_DATA and the reference data R_DATA may not be the same. The test circuit 180 may therefore determine whether the test target cell MC is a failed cell based on a comparison between the test data T_DATA stored in the test target cell MC and the reference data R_DATA written into the test target cell MC.

The test circuit 180 may perform the test operation repeatedly (i.e., the test write operation and the test comparison operation) to different memory cells MC selected by the test row address T_RADD and the test column address T_CADD. For example, a different test target cell MC may be selected by changing sequentially the test column address T_CADD for each test row address T_RADD.

The backup operation, the test operation, and the update operation may be performed sequentially by the unit of a single test target word line (i.e., by the unit of the test target cells MC corresponding to each test row address T_RADD).

For example, when tests on all of the test target cells MC coupled to the test target word line corresponding to the test row address T_RADD are completed, the test circuit 180 may enable the update signal UPDATE for the update operation in response to a next refresh command REF and change the value of the test row address T_RADD. During the update operation, the original data of backup memory cells BMC coupled to the backup word line BWL may be returned to the test target cells MC coupled to the test target word line corresponding to the test row address T_RADD.

In accordance with an embodiment of the present invention, during the test operation after completion of the backup operation for the test target word line, the control circuit may perform a normal access operation to the backup word line for the test target word line thereby updating the original data stored in the backup memory cells BMC. When an active command ACT is applied, the first address storage unit 140 may compare an input address I_RADD with the first address, may enable a backup word line access signal BWL_ACC when the input address I_RADD is the same as the first address, and may disable the backup word line access signal BWL_ACC when the input address I_RADD is different from the first address. Upon completion of the test operation, the memory device may return the updated original data which are stored in the backup memory cells BMC to the test target word line. As such, the memory device may perform the test operation and the normal access operation for the test target word line at the same time.

Furthermore, while a word line corresponding to the counting address C_RADD is refreshed in response to the refresh command REF, the memory device may perform the test operation to the test target word line corresponding to the test row address T_RADD. That is, the memory device may perform the refresh and test operations at the same time. However, the test operation and the refresh operation may not be performed at the same time in a single cell mat. For example, a cell mat on which the refresh operation is performed may be different from a cell mat on which the test operation is performed.

An operation example of the memory device of FIG. 1 will now be described with reference to FIG. 2. More specifically, FIG. 2 shows memory cell arrays of a single cell mat.

Figure 2:
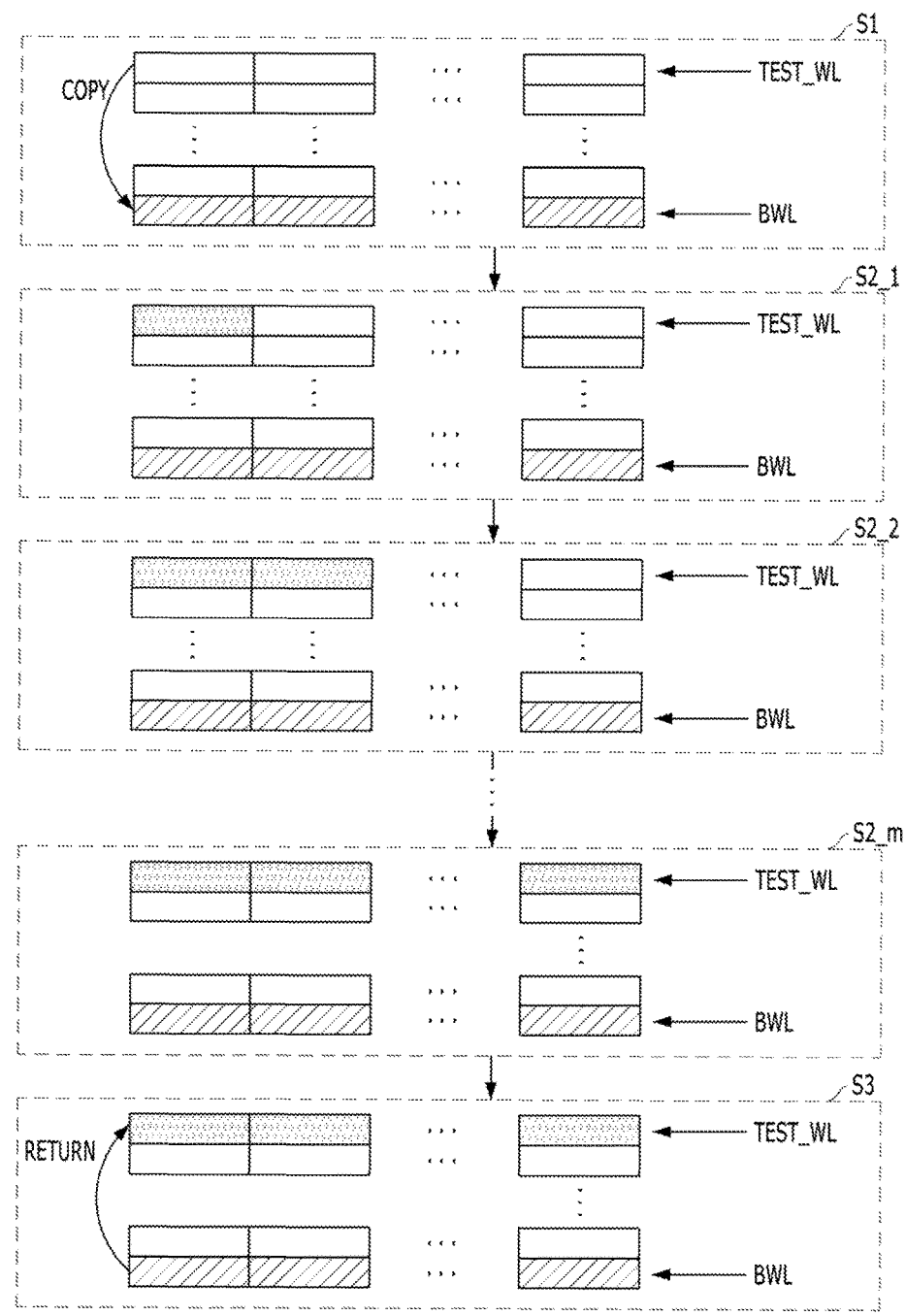
FIG. 2 is a diagram illustrating an operation example of the memory device of FIG. 1.

During a backup operation, the data of the test target cells coupled to a single test target word line TEST_WL are copied to the backup memory cells coupled to the backup word line BWL (denoted by "S1" in FIG. 2).

During a test operation after completion of a backup operation to the test target word line TEST_WL, the test target cells coupled to the test target word line TEST_WL are tested one after another in a sequential manner by changing sequentially the test column address T_CADD (denoted by "S2_1" to "S2_m" in FIG. 2).

During an update operation after completion of the test operation for all the cells coupled to the test target word line TEST_WL, the original data stored in the backup memory cells BMC coupled to the backup word line BWL are returned to the test target cells coupled to the test target word line TEST_WL (denoted by "S3" in FIG. 2).

As such, the backup operation, the test operation and the update operation may be performed sequentially changing the test column address T_CADD for the test target word line TEST_WL. Also, the set of operations (i.e., the backup, test and update operations) may be performed by the unit of a single test target word line. When the set of operations is completed for one test target word line TEST_WL, then a next test target word line is selected and the set of operations is performed for the next test target word line.

Figure 3:
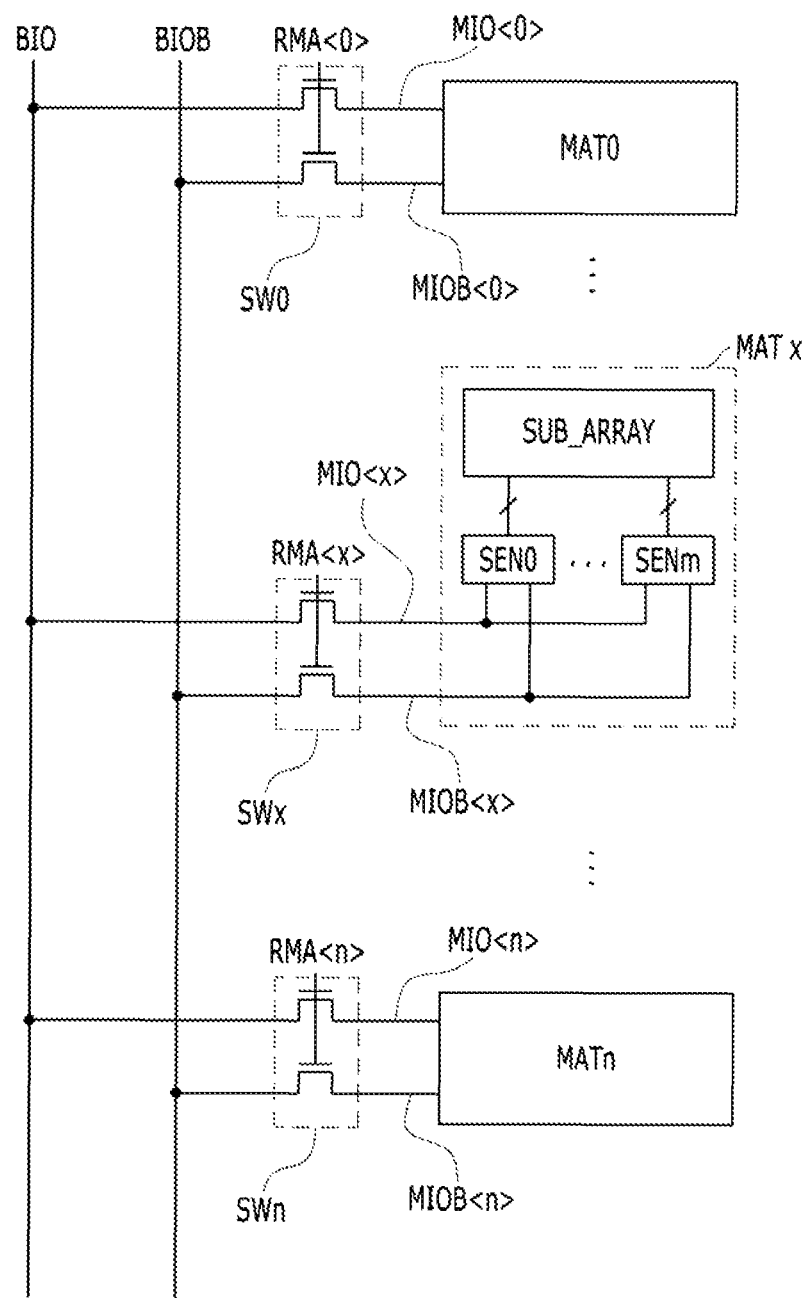
FIG. 3 is a diagram showing a configuration example of a part of a cell array employed in the memory device of FIG. 1.

FIG. 3 is a diagram showing a configuration example of a part of the cell array 110 of FIG. 1.

Referring to FIG. 3, the cell mats MAT0 to MATn may be coupled to first line pairs MIO<0:n> and MIOB<0:n>, respectively. The first line pairs MIO<0:n> and MIOB<0:n> may be coupled to a second data line pair BIO and BIOB through mat switches SW0 to SWn, respectively. The mat switches SW0 to SWn may be turned on and off in response to respective mat selection signals RMA<0:n>. The first line pairs MIO<0:n> and MIOB<0:n> and the second data line pair BIO and BIOB may couple the cell mats MAT0 to MATn and the column circuit 170.

The cell mat MATx may include a sub-array SUB_ARRAY of a plurality of memory cells (not shown) and a plurality of sense amplifiers SEN0 to SENm. Each of the sense amplifiers SEN0 to SENm may amplify the data of each bit line (not shown in FIG. 3).

When a refresh operation and a test operation are performed, the mat selection signals RMA<0:n> are not enabled. Accordingly, although word lines are simultaneously activated in different cell mats for the refresh operation and the test operation, there is not a collision between the data from the different cell mats coupled to the activated word lines because the data of the different cell mats are not transferred to the second data line pairs BIO and BIOB. Accordingly, the refresh operation and the test operation can be performed at the same time.

Figure 4:
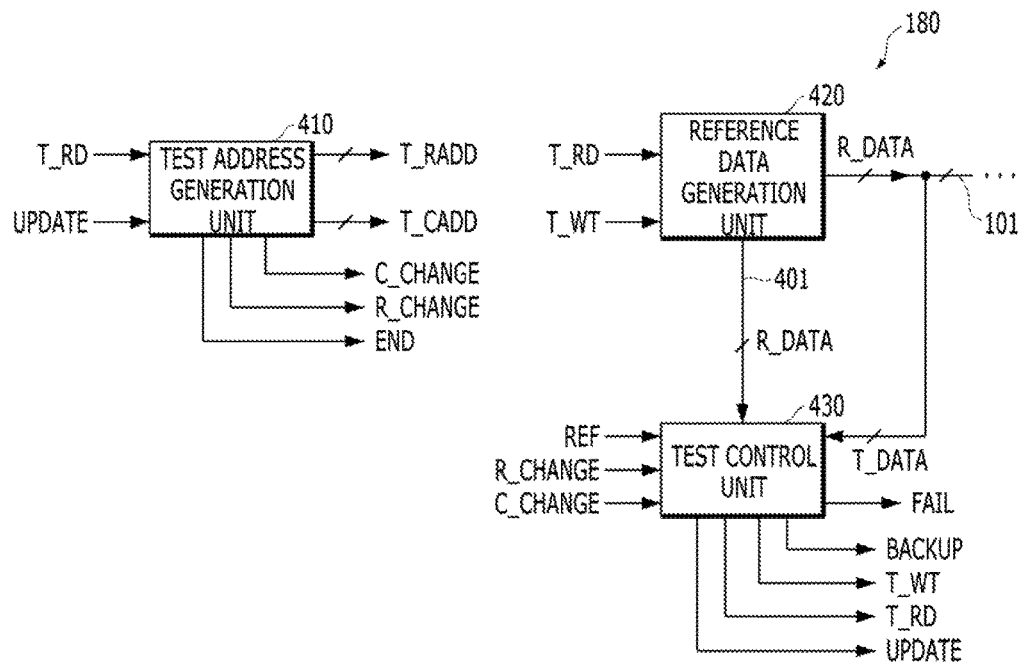
FIG. 4 is a diagram showing a configuration example of a test circuit employed in the memory device of FIG. 1.

FIG. 4 is a diagram showing a configuration example of the test circuit 180.

Referring to FIG. 4 the test circuit 180 may include a test address generation unit 410, a reference data generation unit 420, and a test control unit 430.

The test address generation unit 410 may generate the test row address T_RADD and the test column address T_CADD and change the values of the test row address T_RADD and the test column address T_CADD.

The test address generation unit 410 may change the value of the test column address T_CADD after a lapse of a specific time since the test read signal T_RD is enabled. More specifically, the test address generation unit 410 may increase the value of the test column address T_CADD by 1 after completion of the test comparison operation to the test target cell MC selected by the current value of the column address T_CADD. As described above, the sequential change of the test column address T_CADD may be repeated for each of the test row address T_RADD in order to select a test target cell MC for the backup, test, and the update operations, until all the cells in the word line corresponding to the test row address T_RADD have been selected and subjected to the above set of operations. Upon completion of the above set of operations for all the cells in the test row address T_RADD the same operations are performed for the next test row address T_RADD.

The test address generation unit 410 may change the value of the test row address T_RADD after a lapse of a specific time since the update signal UPDATE is enabled. More specifically, the test address generation unit 410 may increase the value of the test row address T_RADD by 1 after the completion of the update operation to the last test target cell MC selected by the current value of the test row address T_RADD. The sequential change of the test row address T_RADD may be repeated for each of the cell mats MAT0 to MATn for selecting test target cells MC included in another cell mat among the cell mats MAT0 to MATn.

The test address generation unit 410 may enable a column change signal C_CHANGE when the value of the test column address T_CADD is changed and may enable a row change signal R_CHANGE when the value of the test row address T_RADD is changed. Furthermore, the test address generation unit 410 may enable an end signal END when the value of the test column address T_CADD reaches an end value.

The reference data generation unit 420 may generate the reference data R_DATA in response to the test read signal T_RD or the test write signal T_WT. When the test read signal T_RD is enabled, the reference data generation unit 420 may generate the reference data R_DATA and transfer it to the test control unit 430 through lines 401. When the test write signal T_WT is enabled, the reference data generation unit 420 may output the reference data R_DATA to the outside of the test circuit 180 through lines 101.

The test control unit 430 may control the operations of the test control circuit 180. For example, the test control unit 430 may control the copying of the original data of target test memory cells MC into backup memory cells BMC, may control the writing of the reference data R_DATA in the target test memory cells MC during the backup operation, may determine whether a target test memory cell MC is a proper or a failed cell by comparing the test data T_DATA with the reference data R_DATA for the target memory cell during the test operation, and may control the original data of the backup memory cells BMC to be returned to the target test memory cells MC during the update operation.

The test control unit 430 may enable the backup signal BACKUP for the start of the backup operation for the test target cells MC corresponding to the changed test row address T_RADD when a first refresh command REF is applied after the row change signal R_CHANGE is enabled.

The test control unit 430 may enable the test write signal T_WT for the start of the test write operation for each test target cell MC corresponding to the changed test column address T_CADD and the current test row address T_RADD when a second refresh command REF is applied after the row change signal R_CHANGE is enabled. The test control unit 430 may enable the test read signal T_RD for the start of the test comparison operation for each test target cell MC corresponding to the changed test column address T_CADD and the current test row address T_RADD when a third refresh command REF is applied after the row change signal R_CHANGE is enabled.

The test control unit 430 may enable the update signal UPDATE for the start of the update operation for the test target cells MC corresponding to the current test row address T_RADD when the refresh command REF is applied after completion of the test operation to the last test target cell MC corresponding to the current test row address T_RADD when the value of the test column address T_CADD reaches the end value and thus the end signal END is enabled.

Figure 5:
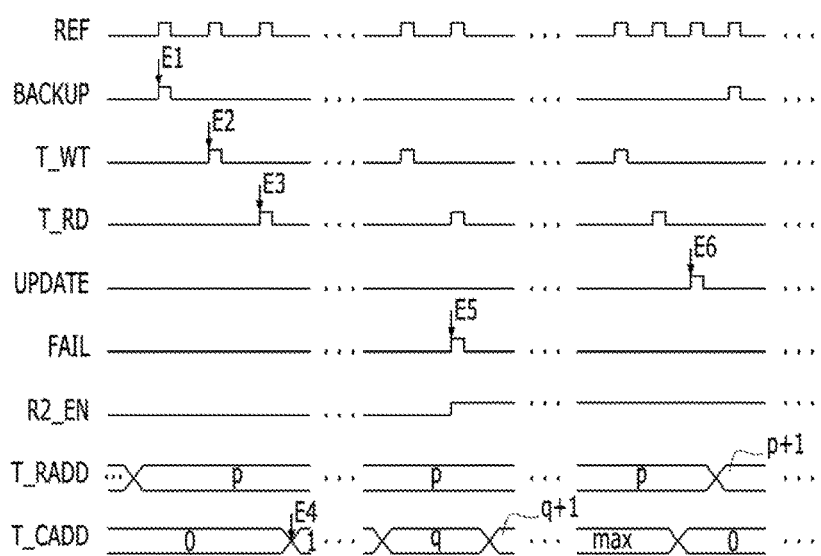
FIG. 5 is a diagram illustrating a test operation example of the memory device of FIG. 1.

FIG. 5 is a diagram illustrating a test operation of the memory device of FIG. 1.

Referring to FIGS. 2 and 5, when the backup signal BACKUP is enabled in response to a refresh command REF (denoted by "E1" in FIG. 5), the original data of the test target cells MC coupled to the test target word line TEST_WL of the test row address T_RADD may be copied to the backup memory cells BMC coupled to the backup word line BWL during the refresh operation (denoted by "S1" in FIG. 2).

Thereafter, when a refresh command REF is applied, the test write signal T_WT may be enabled (denoted by "E2" in FIG. 5), and thus reference data R_DATA may be written in the test target cells MC selected by the test column address T_CADD and the test row address T_RADD during the refresh operation (denoted by "S2_1" to "S2_m" in FIG. 2).

Thereafter, when a refresh command REF is applied, the test read signal T_RD may be enabled (denoted by "E3" in FIG. 5), and the test data T_DATA read from the test target cells MC selected by the test column address T_CADD and the test row address T_RADD may be compared with the reference data R_DATA. The fail signal FAIL may be enabled or disabled based on a result of the comparison (denoted by "S2_1" to "S2_m" in FIG. 2). FIG. 5 exemplifies the current test target cell MC as normal and thus the fail signal FAIL as disabled. When the test operation to the current test target memory cell MC is completed, the value of the test column address T_CADD may be changed for the test operation to the next test target cell MC (denoted by "E4" in FIG. 5).

When one or more of the test target cells MC coupled to the test target word line TEST_WL of the test row address T_RADD are determined as a fail during repetition of the test operation to all the test target cells MC coupled to the test target word line TEST_WL of the test row address T_RADD, the test row address T_RADD may be stored in the second address storage unit 150 as the second address, and the second refresh enable signal R2_EN may be enabled (denoted by "E5" in FIG. 5). FIG. 5 shows an example in which the value of the test column address T_CADD is increased by 1 starting from an initial value 0 and is changed to the initial value 0 again after reaching an end value "max." Furthermore, FIG. 5 shows an example in which a fail is detected when the test column address T_CADD is "q".

When the test operation to all of the test target cells MC coupled to the test target word line TEST_WL of the test row address T_RADD is completed, the update signal UPDATE may be enabled in response to a refresh command REF (denoted by "E6" in FIG. 5). The original data of the backup memory cells BMC coupled to the backup word line BWL may be returned to the test target cells MC coupled to the test target word line TEST_WL of the test row address T_RADD during the refresh operation (denoted by "S3" in FIG. 2). Thereafter, the value of the test row address T_RADD may be changed for performing the test operation to the test target cells MC coupled to the next test target word line. FIG. 5 shows an example in which the value of the test row address T_RADD is changed from "p" to "p+1."

Figure 6:
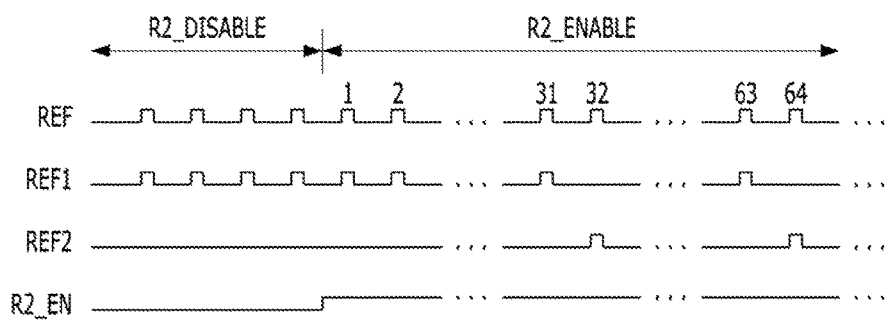
FIG. 6 is a diagram illustrating a refresh operation of the memory device of FIG. 1, according to a first embodiment of the present invention.

FIG. 6 is a diagram illustrating a refresh operation of the memory device of FIG. 1, according to a first embodiment of the present invention.

Referring to FIG. 6, while the second refresh enable signal R2_EN has been disabled (denoted by "R2_DISABLE" in FIG. 6), the memory device may perform only the first refresh operation for refreshing word lines selected sequentially by the counting address C_RADD. While the second refresh enable signal R2_EN is enabled (denoted by "R2_ENABLE" in FIG. 6), both of the first refresh and the second refresh may be performed for the counting address C_RADD and the IR address IR_RADD, respectively. Thus, according to the first embodiment, the second refresh may be performed when a specific number (e.g., 32) of the refresh commands REF has been applied.

Figure 7:
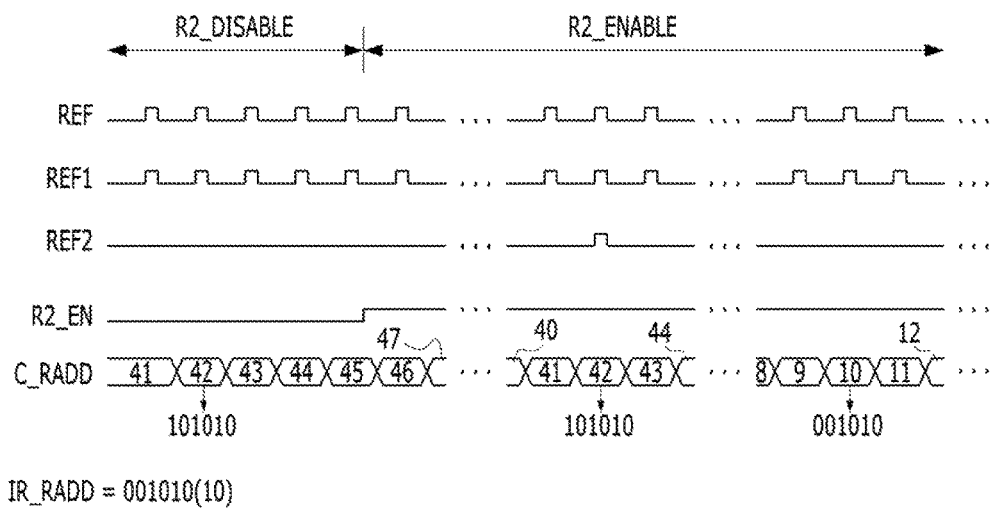
FIG. 7 is a diagram illustrating a refresh operation of the memory device of FIG. 1, according to a second embodiment of the present invention.

Referring now to FIG. 7 a refresh operation of the memory device of FIG. 1 according to a second embodiment will be described. Specifically, FIG. 7 shows an example in which the number of bits of each of the counting address C_RADD and the IR address IR_RADD is 6 bits. As described above, the IR address IR_RADD represents the row address of a failed memory cell. The second address storage unit 150 may store the test row address T_RADD as the second address when the fail signal FAIL representing an occurrence of a failed memory cell is enabled. The second address storage unit 150 may output the stored second address as the IR address IR_RADD.

Referring to FIG. 7, while the second refresh enable signal R2_EN has been disabled (denoted by "R2_DISABLE" in FIG. 7), the memory device may perform only the first refresh operation for refreshing word lines sequentially selected by the counting address C_RADD. While the second refresh enable signal R2_EN is enabled (denoted by "R2_ENABLE" in FIG. 7), both of the first refresh and the second refresh may be performed together.

In a second refresh operation, when a predetermined number of bits are the same and the remaining bits are different between the counting address C_RADD and the IR address IR_RADD, the second refresh signal REF2 may be enabled when the refresh command REF is applied. For instance that the second address or the IR address IR_RADD stored in the second address storage unit 150 is 001010 (representing decimal "10"). When the second refresh enable signal R2_EN is enabled, the IR address IR_RADD having the value of 001010 may be outputted by the second address storage unit 150. When the counting address C_RADD is 001010, that is, when all the bits of the counting address C_RADD and the IR address IR_RADD are the same, the first refresh signal REF1 may be enabled in response to a refresh command REF, and the word line corresponding to the counting address C_RADD having the value of 001010 may be refreshed.

Next, when the counting address C_RADD has the value of 101010 (representing decimal "42") when a refresh command REF is applied, the first refresh signal REF1 may be enabled, and the word line corresponding to the counting address C_RADD of the value 101010 is subjected to the first refresh operation. At the same time, the second refresh signal REF2 may be also enabled because a predetermined number of bits or the highest bit of the counting address C_RADD and the IR address IR_RADD is different and the remaining 5 bits are the same, and thus the word line corresponding to the IR address IR_RADD having the value of 001010 may be subjected to the second refresh operation.

In this case, the predetermined number of bits of the counting address C_RADD and the IR address IR_RADD compared in order to determine whether or not to perform the second refresh may correspond to the number of the second refresh operations performed to the failed memory cells corresponding to the IR address IR_RADD during the refresh section. For example, it is assumed that the number of bits of each of the counting address C_RADD and the IR address IR_RADD is 10 bits. When the predetermined number of bits is set to "k" bits, the second refresh operation may be to the failed memory cells corresponding to the IR address IR_RADD when lower 10-k bits are the same and upper k bits of the 10 bits are different among the 10 bits of the addresses C_RADD and IR_RADD. The total number of the second refresh operations performed to the failed memory cells corresponding to the IR address IR_RADD during the refresh section may be $(2^k-1)$ times while the first refresh operation is performed once to the failed memory cells during the refresh section. The total number of both of the first and second refresh operations performed to the failed memory cells corresponding to the IR address IR_RADD during the refresh section may be $2^k$.

FIG. 7 shows an example wherein the value "k" is 1. Therefore, the total number of both of the first and second refresh operations performed to the failed memory cells corresponding to the IR address IR_RADD during the refresh section may be 2.

Referring to FIG. 7 wherein "k" is 1, during the deactivation of the second refresh operation (denoted by "R2_DISABLE" in FIG. 7), the second refresh signal REF2 is not be enabled. During the activation of the second refresh operation (denoted by "R2_ENABLE" in FIG. 7), the first refresh signal REF1 is enabled when all the bits of the IR address IR_RADD and the counting address C_RADD are the same, and the first refresh signal REF is enabled for the counting address C_RADD while the second refresh signal REF2 is enabled for the IR address IR_RADD when the upper 1 bits of the IR address IR_RADD and the counting address C_RADD are different and lower 5 bits are the same.

FIGS. 8a and 8b are diagrams illustrating the first and second refresh operations performed in accordance with the second embodiment.

It is assumed, as an example, that the memory device includes 8196 word lines WL0 to WL8195. Accordingly, each of the counting address C_RADD and the IR address IR_RADD may be a signal of 13 bits. Furthermore, it is assumed that the IR address IR_RADD has the value of "0000000001010" (representing decimal "10") in the second address storage unit 150, which means that the failed memory cell is coupled to the word line of the address value "0000000001010".

FIG. 8a shows the example wherein "k" is 1. Therefore, the total number of both of the first and second refresh operations performed to the failed memory cells corresponding to the IR address IR_RADD during the refresh section may be 2 ($=2^1$).

Referring to FIG. 8a, when the counting address C_RADD has the value of "0000000001010" (decimal "10"), the first refresh operation may be performed to the failed memory cell coupled to the word line of the address value "0000000001010". Further, when the counting address C_RADD has the value of "1000000001010" (decimal "4106"), the first refresh operation may be performed to the normal memory cell coupled to the word line of the address value "1000000001010" while the second refresh operation is performed to the failed memory cell coupled to the word line of the address value "0000000001010".

FIG. 8b shows the example wherein "k" is 2. Therefore, the total number of both of the first and second refresh operations performed to the failed memory cells corresponding to the IR address IR_RADD during the refresh section may be 4 ($=2^2$).

Referring to FIG. 8b, when the counting address C_RADD has the value of "0000000001010" (decimal "10"), the first refresh operation may be performed to the failed memory cell coupled to the word line of the address value "0000000001010". Further, when the counting address C_RADD has one of the values "0100000001010" (decimal "2058"), "1000000001010" (decimal "4106") and "1100000001010" (decimal "6154"), the first refresh operation may be performed to the normal memory cell coupled to the word line of the corresponding one of the address values "0100000001010" (decimal "2058") "1000000001010" (decimal "4106") and "1100000001010" (decimal "6154") while the second refresh operation is performed to the failed memory cell coupled to the word line of the address value "0000000001010".

The memory device described with reference to FIGS. 1 to 8 can detect memory cells having a data retention time not exceeding a reference and store the address of such memory cells, thereby increasing refresh frequency. Accordingly, a memory device including memory cells having a data retention time not exceeding a reference can normally operate.

An operating method of the memory device is described below with reference to FIGS. 1 to 8b.

In the memory device of FIG. 1, the test circuit 180 may generate the test row address T_RADD and the test column address T_CADD so that one or more target test memory cells MC is selected among the plurality of memory cells MC (a test target cell selection step). Next, the test circuit 180 may control the copying of the original data of the test target cells MC which are coupled to the test target word line corresponding to the test row address T_RADD is copied to the backup memory cells BMC coupled to the backup word line BWL (a data backup step).

The test circuit 180 may perform the test operation (i.e., the test write operation and the test comparison operation) to the target test memory cells MC. The test circuit 180 may also control the writing of the reference data R_DATA in the target test memory cells MC, may compare the test data T_DATA, which is read from the target test memory cells MC, with the reference data R_DATA after a lapse of the reference time, and may determine whether the target test memory cells MC are proper or failed cells (a test step).

During the test step, the test circuit 180 may determine the target test memory cells MC to be a properly functioning cell if, as a result of the determination, it is determined that the test data T_DATA is the same as the reference data R_DATA. During the test step, the test circuit 180 may determine the target test memory cells MC to be failed cells if it is determined that the test data T_DATA is different from the reference data R_DATA. If it is determined that the target test memory cells MC are failed cells, the test circuit 180 may perform control so that the row address of the target test memory cells MC is stored in the second address storage unit 150 as the second address or the IR address IR_RADD. During the test operation, the control circuit may perform control so that the backup memory cells BMC are accessed instead of the target test memory cells MC thereby updating the original data when needed.

When the test operation is completed, the test circuit 180 may return the original data of the backup memory cells BMC to the target test memory cells MC (an update step).

During the refresh operation, the control circuit may perform control so that the failed memory cells MC corresponding to the second address or the IR address IR_RADD stored in the second address storage unit 150 may be refreshed with higher frequency compared to normal memory cells MC. More specifically, the control circuit may perform control so that the failed memory cells MC are subjected to the second refresh operation more than once.

In this technology, memory cells having a data retention time not exceeding a reference time may be detected by performing a test on the memory cells while the memory device operates.

In this technology, memory cells having a data retention time not exceeding reference time may normally operate when the data retention time of the memory cells does not exceed the reference time by controlling the refresh operation of the memory device.

Although various embodiments have been described for illustrative purposes, it will be apparent to those skilled in the art that various changes and modifications may be made without departing from the spirit and/or scope of the invention as defined in the following claims.

What is claimed is:

1. A memory device, comprising:
a plurality of memory cells;
one or more backup memory cells;
a test circuit suitable for sequentially performing a backup operation, a test operation and an update operation to a test target cell selected among the plurality of memory cells, by unit of the test target cell corresponding to a test row address, in response to a refresh command; and
a control circuit suitable for accessing the backup memory cells when an input address corresponding to an active command is the same as an address of the test target cell, during the test operation,
wherein, during the backup operation, the test circuit controls the control circuit to copy an original data of the test target cell to a corresponding backup memory cell selected among the backup memory cells, and
wherein, during the test operation, the test circuit determines whether the test target cell is a pass or a fail.

2. The memory device of claim 1,
wherein, during the update operation, the test circuit controls the control circuit to return the original data of the corresponding backup memory cell back to the test target cell.

3. The memory device of claim 1, wherein the test circuit performs the test operation by writing reference data in the test target cell; reading test data of the test target cell a specific time after the writing of the reference data; and determining the test target cell as a failed cell when the test data is different from the reference data.

4. The memory device of claim 1, wherein the control circuit further performs a refresh operation so that one or more of the memory cells determined as failed cells during the test operation are refreshed with higher frequency than other memory cells.

5. The memory device of claim 1, wherein the control circuit stores the address of the test target cell as a first address, and when the test target cell is determined as the fail, stores the address of the test target cell as a second address.

6. The memory device of claim 5,
wherein the control circuit controls the access to the backup memory cells when the input address is the same as the first address, and
wherein, during a refresh section, the control circuit performs an additional refresh operation to one or memory cells, which are determined as failed cells, according to the second address while performing a no refresh operation to the plurality of memory cells according to a normal refresh counting address.

7. The memory device of claim 6, wherein the control circuit performs the additional refresh operation whenever the normal refresh operation is performed a predetermined number of times.

8. The memory device of claim 6, wherein the control circuit performs the additional refresh operation when a predetermined number of bits are the same between the second address and the normal refresh counting address of a current normal refresh operation.

9. An operating method of a memory device comprising a plurality of memory cells and one or more backup memory cells, the operating method comprising:
performing a backup operation to copy an original data of a test target cell among the plurality of memory cells to a corresponding one of the backup memory cells;
performing a test operation to determine whether the test target cell is a pass or a fail cell;
controlling the backup memory cells to be accessed when an input address corresponding to an active command is the same as an address of the test target cell, during the test operation after the backup operation; and
performing an update operation to return the original data of the corresponding backup memory cell back to the test target cell after performing of the test operation, where the backup, test, and update operations are sequentially performed by unit of the test target corresponding to a test row address, in response to a refresh command.

10. The operating method of claim 9, wherein, the test operation includes writing reference data in the test target cell; reading test data of the test target cell a specific time after the writing of the reference data; and determining the test target cell as a failed cell when the test data is different from the reference data.

11. The operating method of claim 9, further comprising performing a refresh operation so that one or more of the memory cells determined as failed cells during the test operation are refreshed with higher frequency than other memory cells.

12. The operating method of claim 9,
wherein the performing of the backup operation includes storing the address of the test target cell as a first address, and
wherein the performing of the test operation includes storing the address of the test target cell as a second address when the test target cell is determined as the fail.

13. The operating method of claim 12,
wherein the controlling of the backup memory cells is performed when the input address is the same as the first address, and
further comprising, during a refresh section, performing an additional refresh operation to one or more memory cells, which are determined as failed cells, according to the second address while performing a normal refresh operation to the plurality of memory cells according to a normal refresh counting address.

14. The operating method of claim 13, wherein the additional refresh operation is performed whenever the normal refresh operation is performed a predetermined number of times.

15. The operating method of claim 13, wherein the additional refresh operation is performed when a predetermined number of bits are the same between the second address and the normal refresh counting address of a current normal refresh operation.

* * * * *